(12) United States Patent
Tzu et al.

(10) Patent No.: US 6,631,307 B1
(45) Date of Patent: Oct. 7, 2003

(54) USE OF LOGICAL OPERATIONS IN PLACE OF OPC SOFTWARE

(75) Inventors: San-De Tzu, Taipei (TW); Yi-Hsu Chen, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/044,347

(22) Filed: Mar. 19, 1998

(51) Int. Cl.⁷ .................. G06F 19/00; G06F 17/50
(52) U.S. Cl. .................. 700/163; 700/121; 716/21; 430/5
(58) Field of Search .................. 700/163, 121; 430/5; 716/19, 20, 21

(56) References Cited

U.S. PATENT DOCUMENTS

| | | | |
|---|---|---|---|
| 5,553,273 A | | 9/1996 | Liebmann .................. 395/500 |
| 5,657,235 A | | 8/1997 | Liebmann et al. ..... 364/474.24 |
| 5,663,893 A | * | 9/1997 | Wampler et al. ............ 364/491 |
| 5,723,233 A | * | 3/1998 | Garza et al. .................... 430/5 |
| 5,795,688 A | * | 8/1998 | Burdorf et al. ................ 430/30 |
| 5,889,932 A | * | 3/1999 | Adegeest et al. ........... 395/117 |
| 5,900,338 A | * | 5/1999 | Garza et al. .................... 430/5 |
| 5,920,487 A | * | 7/1999 | Reich et al. ................. 364/491 |
| 5,972,541 A | * | 10/1999 | Sugasawara et al. .......... 430/5 |
| 5,978,501 A | * | 11/1999 | Badger et al. .............. 382/144 |

\* cited by examiner

*Primary Examiner*—James P. Trammell
*Assistant Examiner*—Mary Cheung
(74) *Attorney, Agent, or Firm*—George O. Saile; Stephen B. Ackerman

(57) ABSTRACT

A method is described which allows certain Optical Proximity Corrections to be computed in a few minutes. This has been achieved by limiting changes to the optical mask to the addition of two sets of serifs (one larger than the other) at the appropriate vertices in the layout mask. A key feature of the method is that identification of which serifs will be within a critical distance from a neighbouring edge (and have therefore to be smaller) is performed by the application of a few simple logical operations. This results in a corrected mask that can be generated in a few minutes, as opposed to many hours.

11 Claims, 7 Drawing Sheets

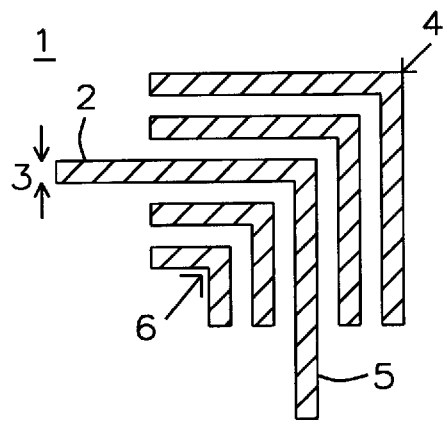
FIG. 1a – Prior Art
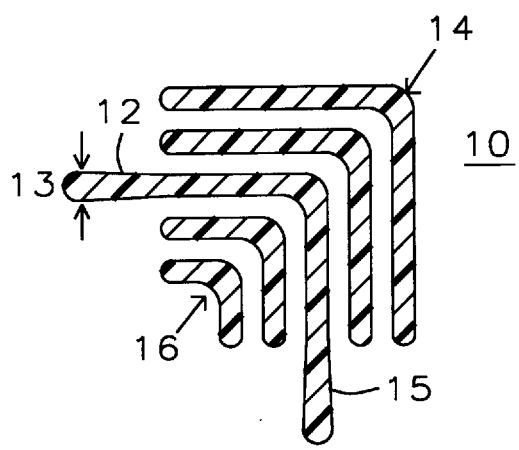
FIG. 1b – Prior Art
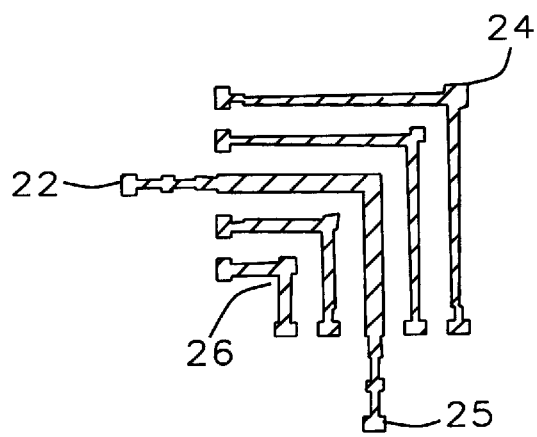
FIG. 2a – Prior Art

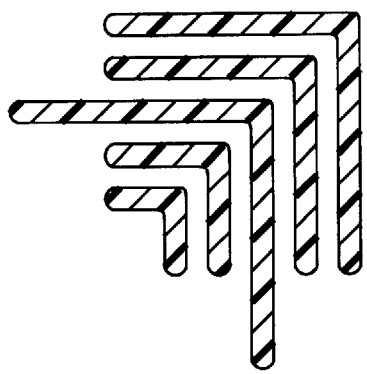
FIG. 2b – Prior Art
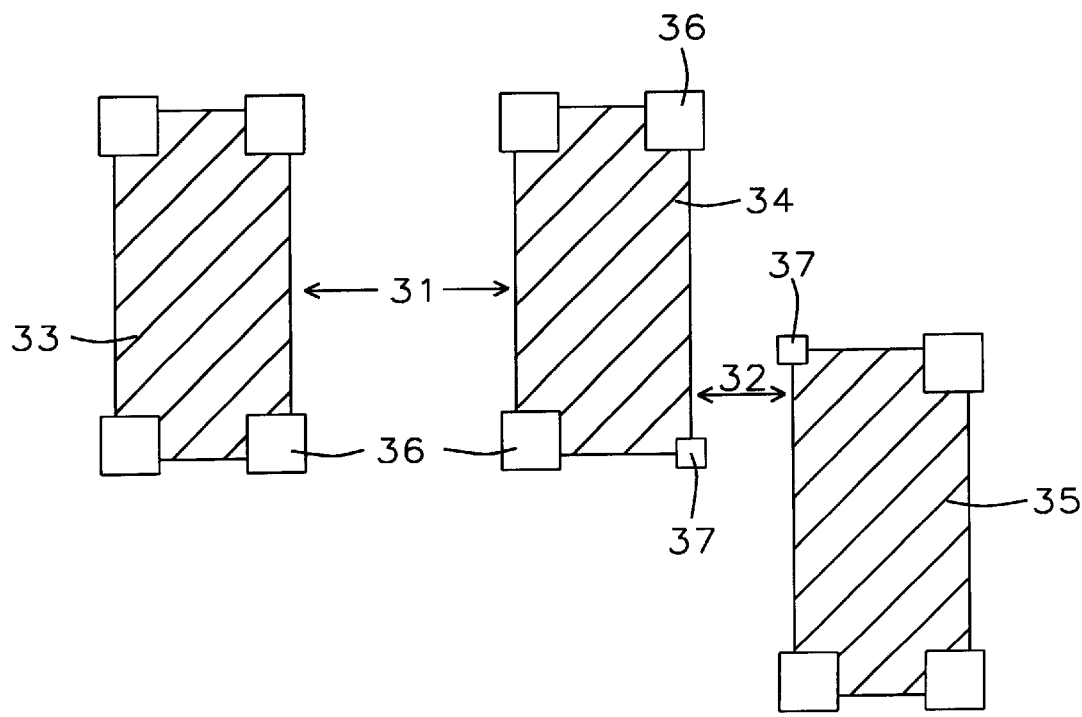
FIG. 3

USE OF LOGICAL OPERATIONS IN PLACE OF OPC SOFTWARE

FIELD OF THE INVENTION

The invention relates to the general field of image distortion due to Optical Proximity Effects with particular reference to ways to correct for this effect.

BACKGROUND OF THE INVENTION

The proximity effect is a form of optical distortion associated with photoresist images. For a given development time, whether or not a given area of a photoresist layer will be left or removed after the development process depends on the total amount of energy deposited in that area during its exposure to radiation. Image features whose size and/or separation approach the resolution limit of said radiation will thus be subject to distortion that depends on how the diffraction maxima and minima, that lie on both sides of a 'sharp' edge, interact with one another.

The proximity effect can be compensated for, at least in part, by modifying any given feature in the opposite direction to the expected distortion. Thus, a line that would otherwise come out too narrow can be drawn as wider than its true width, etc. The data that represents the information from which a mask suitable for use in photolithography can be generated, is stored in a data file so corrections to allow for the proximity effect will also be stored there. The overall nature and scope of these corrections, and how they get into the file, will vary with the application and the user.

The optical proximity correction (OPC) is commonly calculated by summing two Gaussian functions whose value depend on a critical dimension (CD) defined by the design rules as well as on the wave-length of the exposing radiation. In general, the distortion of lines that are part of a dense assemblage will be more positive than the distortion of isolated lines in optical mode. While OPCs obtained in this manner provide satisfactory results, the computation time can be very long, typically about 16 hours for a single mask file using state of the art computers.

An examination of the changes made to mask images as a result of applying OPC, shows that the OPC takes two princial forms—scatter bars and serifs. The present invention is concerned only with the latter. A serif is a small square that is added to the corner, or vertex, of a stripe. Vertices may be positive or negative, corresponding to whether they are convex or concave. A positive serif extends the boundaries of a positive vertex while a negative serif reduces the boundaries of a negative vertex.

Referring now to FIG. 1a, an example of a pattern of stripes is shown such as might form part of a layout mask for an integrated circuit. FIG. 1b shows the photoresist image that is obtained from the pattern of FIG. 1b in the absence of any OPC. Several distortions of the original pattern can be seen to have taken place. The stripes have thickened at their ends (where they are not close to any other stripe). Thus dimension 3 of stripe 2 (for example) can be seen to be less than dimension 13 of stripe 12. Similarly, the part of stripe 5 that is not near other stripes has been thickened in stripe 15. It can also be seen that the lengths of stripes 12 and 15 is less than the lengths of stripes 2 and 5.

Another important form of distortion can be seen to have occurred at positive vertex 4 and negative vertex 6. Vertex 14 has been truncated, giving the corner a rounded appearance while at vertex 16 just the opposite has occurred and the strip boundary can be seen to have cut the corner. Finally, the ends of all stripes in FIG. 1b can be seen to be rounded, even though they are quite square in FIG. 1a.

FIG. 2a shows the pattern of FIG. 1a after it has received the full OPC treatment. Of interest in the present context are the serifs that have been added to the pattern. Examples are positive serif 24 that has been added at vertex 4 and negative serif 26 that has been added at vertex 6. Note also the hammer-heads that have been added to the line ends (for example at 22 or 25). Such hammerheads are the result of the merger of the two serifs that were added separately to the two vertices located at the stripe's end.

FIG. 2b shows the photoresist pattern obtained as a result of exposing through a mask containing the pattern of FIG. 2a. It is readily seen that the pattern in FIG. 2b is very close to the original pattern (FIG. 1a).

As already noted, the cost of computing a full OPC as exemplified in FIG. 2a, is very high. Since it is apparent that much of the distortion due to proximity effects can be removed by the appropriate placement of serifs, a method of OPC that adds only serifs might be as effective as the full OPC treatment, provided that the distortions that have not been corrected do not introduce shorts, opens, hot spots, etc. in the line patterns that end up being formed in the integrated circuit.

A number of approaches have been taken in the prior art to dealing with the proximity effect without the need to perform the full OPC calculation. Wampler et al. (U.S. Pat. No. 5,663,893 September 1997) describe a method of simplifying the Optical Proximity Correction by adding positive and negative scatter bars as well as positive and negative serifs. The main thrust of this invention is directed towards teaching a method for handling large data files that represent wiring layouts and no specifics are provided as to how the serifs are incorporated in the line drawings. No information is presented as to what cost savings, if any, their methodology provides.

Liebmann (U.S. Pat. No. 5,553,273 September 1996) aims to correct Optical Proximity Effects by biassing critical portions of the design. In particular, this invention attempts to minimize the creation of new vertices so that it actually teaches away from the practice of using serifs.

Liebmann et al. (U.S. Pat. No. 5,657,235 August 1997) use the OPC data to drive the mask writer itself rather than changing the data design file. By assigning relative mask writer doses, as needed, they are able to bring about continuous line width variations (to compensate for OP effects) without increasing the size of the data design file. Serifs and scatter bars are not involved.

SUMMARY OF THE INVENTION

It has been an object of the present invention to provide a method for correcting distortions due to the Optical Proximity Effects.

Another object of the invention has been that said method require the use of very little computer time, particularly when compared to existing methods for computing Optical Proximity Corrections.

Yet another object has been that said method not require more computer memory than is used by the existing methods.

These objects have been achieved by limiting correction of the optical mask to the addition of two sets of serifs (one larger than the other) at the appropriate vertices in the layout mask. A key feature of the method is that identification of which serifs will be within a critical distance from a neighbouring edge (and have therefore to be smaller) is performed by the application of a few simple logical operations. This results in a corrected mask that can be generated in a few minutes, as opposed to many hours.

BRIEF DESCRIPTION OF THE DRAWINGS

FIGS. 1a and b show how the proximity effect can distort a photoresist image relative to the original mask.

FIGS. 2a and b show how the addition of compensating features, particularly serifs, to the original mask can cancel out the distortions seen in FIG. 1b.

FIG. 3 illustrates how the size of a serif depends on its location relative to neighbouring lines.

DESCRIPTION OF THE PREFERRED EMBODIMENTS

Figure 4:
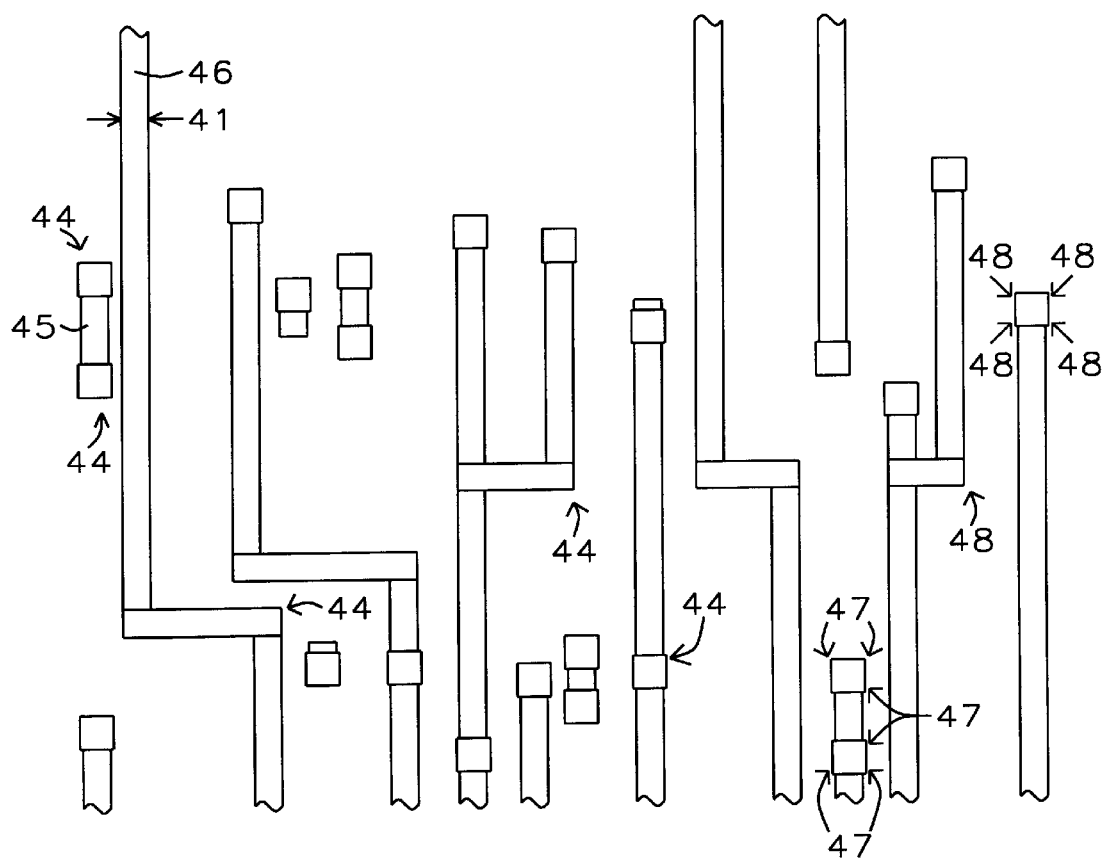
FIG. 4 is an example of a typical layout mask of the kind that is used in integrated circuit manufacture.

As discussed above, a significant amount of OPC can be accomplished by the addition of serifs alone. To avoid line-end shortening and corner rounding, serifs need to be attached to the pattern at all vertices. However, the size of the attached serif will vary with the distance of the vertex being modified from other nearby lines. For example, as illustrated in FIG. 3, stripes 33 and 34 are separated by a distance 31 whereas stripes 34 and 35 are separated by distance 32. Because 32 is significantly less than 31, serifs 37 have been made significantly smaller than all other serifs (such as 36) in the figure.

In general, then, the closer the serif is to nearby lines, the smaller it will need to be. The actual relationship between serif size and the separation between stripes is determined by experiment on a case by case basis.

Since the intent of the present invention is to provide a method for adding serifs to a line pattern with the minimum of computation time, in the example that we will outline below we will describe the use of only two serif sizes that are added only at positive vertices but it will be understood that the method may readily be extended to a range of serif sizes and to negative, as well as positive, vertices.

Referring now to FIG. 4, we show there a small portion of a mask layout pattern of the type used for integrated circuit wiring. The pattern shown is what is intended to end up as a photoresist image but, as already discussed, once the stripe widths and stripe separation distances approach the wavelengths of the actinic radiation that is used to form the photoresist image, considerable distortion will occur unless corrective measures are implemented.

For patterns such as that of FIG. 4, typical line widths 41 will be between about 0.2 and 0.4 microns while the separation between stripes will vary from as much as 0.4 microns to as little as 0.2 microns. The lower end of these ranges is seen to be close to the wavelength of the actinic radiation being used to expose the photoresist. This is between about 0.248 and 0.365 microns. For simplification purposes the method of the present invention defines a critical distance, or amount of separation between lines, at or below which smaller serifs will be added while for separations that exceed the critical amount the larger serifs will be used.

The critical amount defined above may be determined empirically based on experience or it may be computed as a function of the wavelength of the actinic radiation used for photoresist exposure. In practice the critical amount will be between about 1 and 2 times the critical dimension.

The pattern shown in FIG. 4 is stored in a machine readable data file that includes, inter alia, the location of the vertices, some of which are shown in FIG. 4 as examples 44.

Figure 5:
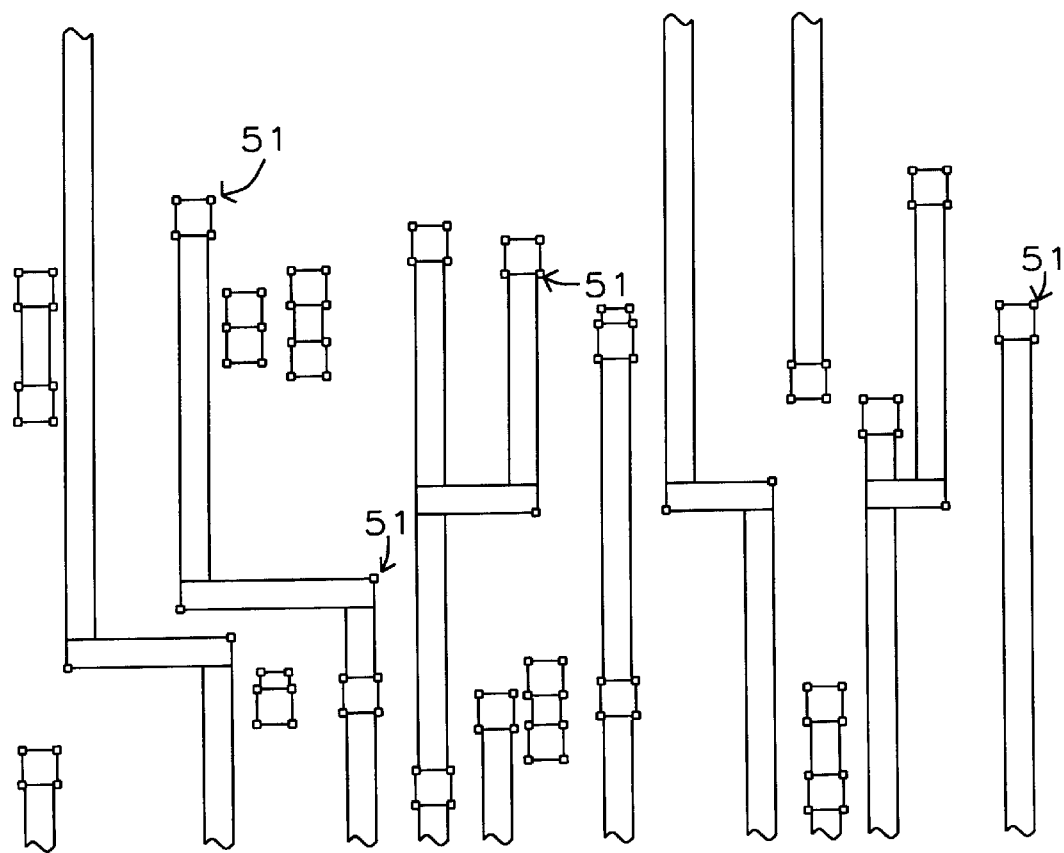
FIG. 5 shows small serifs added at all vertices of the layout.

Referring now to FIG. 5, the pattern of FIG. 4 can be seen to have been modified by the addition of small serifs, such as 51 to all vertices. The linear dimension of these small serifs is between about 0.03 and 0.04 microns (for a 0.2 micron line width). This first set of serifs has been placed on all vertices, regardless of whether or not there is a neighbouring line nearby that is separated from the serif by less than the critical amount. As discussed above, vertices that are located within this critical distance require a smaller serif than vertices that are well removed from nearby edges.

Figure 6:
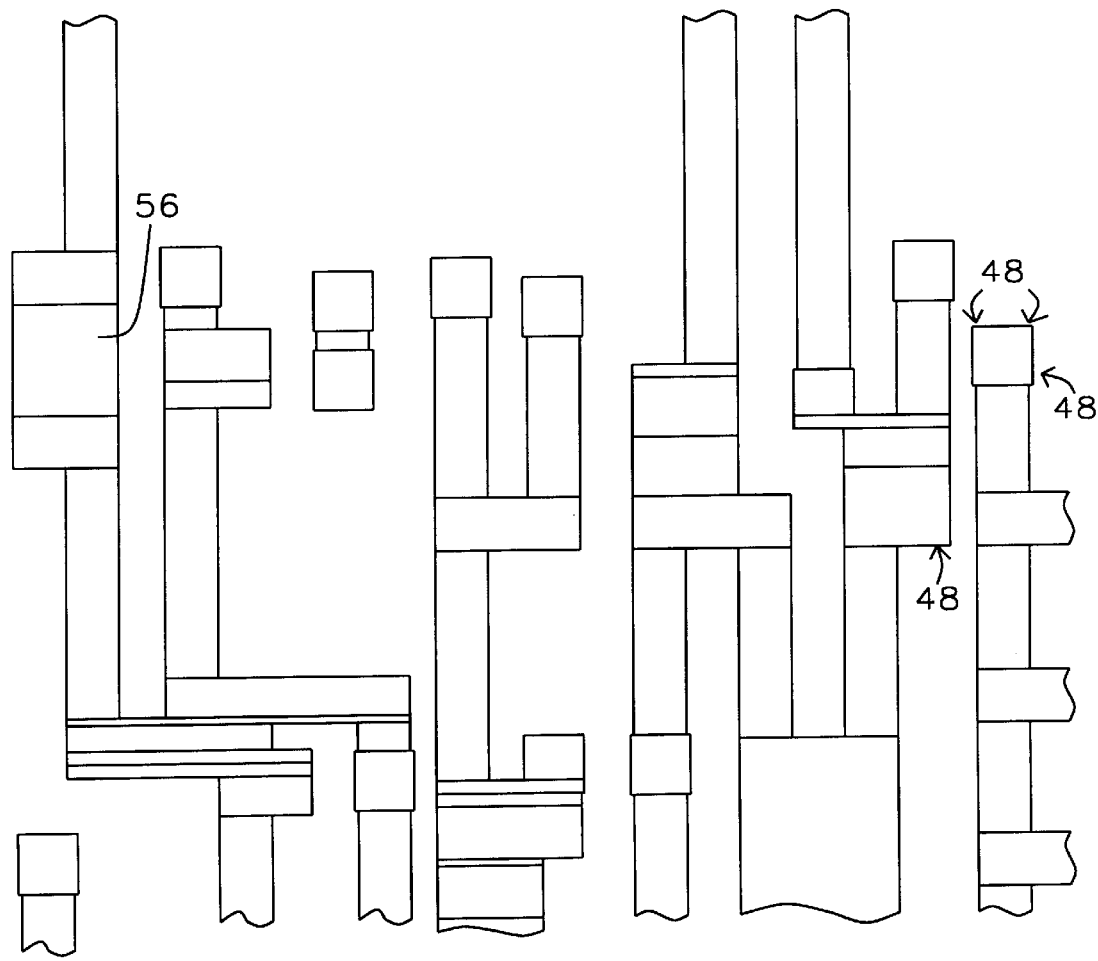
FIG. 6 shows the 'enlarged layout' version of FIG. 4.

Normally, computation of which vertices have neighbouring lines located within the critical distance, and which do not, can consume substantial amounts of time, thereby defeating one of the main objects of the invention. In FIG. 6 we illustrate a key feature of the invention which allows this computation to be performed very rapidly. What is shown is an enlarged layout mask generated by widening all stripes (symmetrically on both sides) by the critical amount. Note that in some cases adjoining lines have overlapped as a result of the enlargement and are now seen as a single stripe. For example, stripe 45 (FIG. 4) has merged into stripe 46 (also FIG. 4) to become stripe 56 (in FIG. 6).

Numerous examples of stripes merging together can be found by comparing FIGS. 4 and 6. Of significance is that the steps of widening and merging the stripes can be performed very rapidly by means of simple logical operations such as sizing. It will also be seen that, as a result of the merging operation, several of the vertices present in FIG. 4 have now vanished from FIG. 6. For example, vertices labelled 47 have all vanished whereas vertices labelled 48 have not. It is also readily apparent that the vertices that have vanished are the ones that were within a critical distance from a neighbouring stripe.

Figure 7:
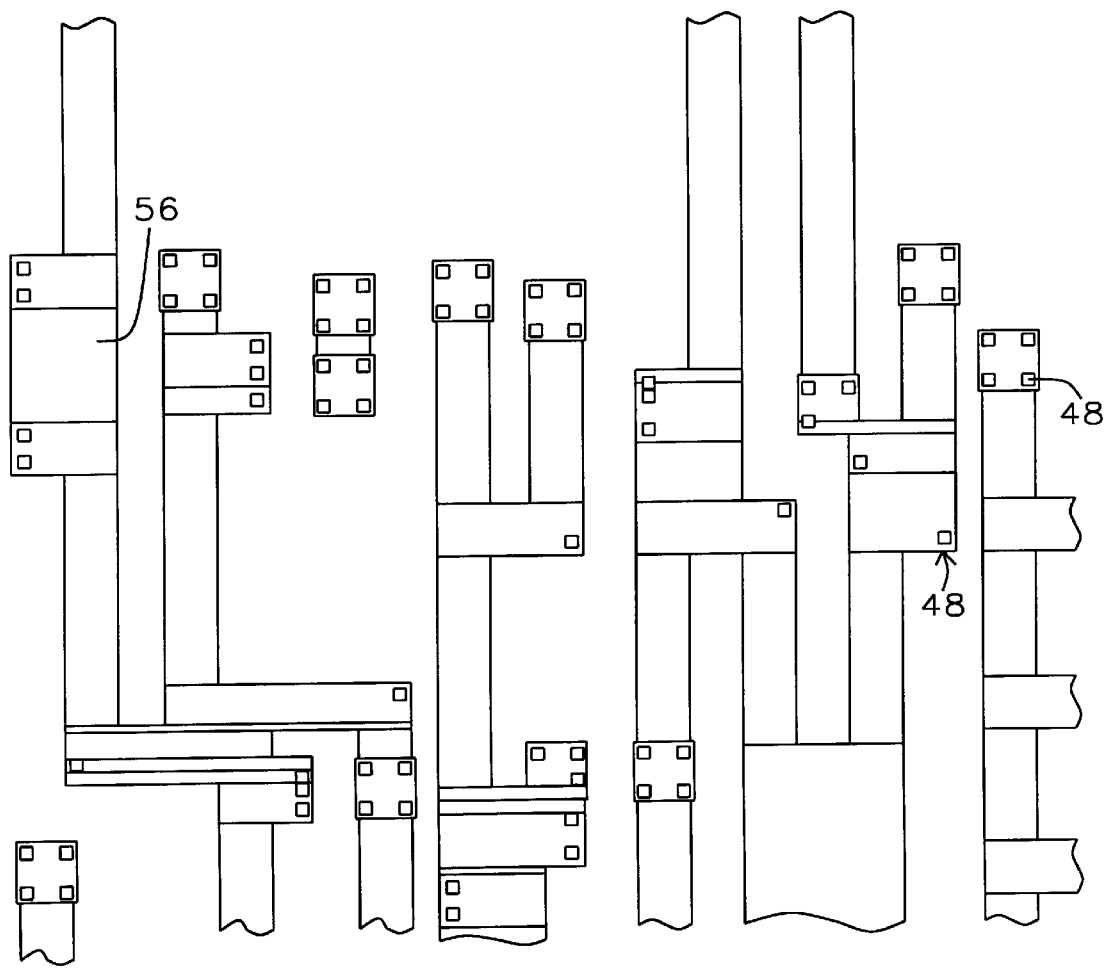
FIG. 7 marks the locations of the larger serifs.

Thus, by the application of simple logical operations, the vertices at which the larger serifs must be placed have all been identified (being those that survived the widening and merging). Note that, because of the widening, the locations of the surviving vertices are not quite the same as that of the original, pre-widening vertices. However, the latter are known to be located less than 1.5 times the critical distance away from the surviving vertices, so substitution of the correct co-ordinates can be performed very rapidly. FIG. 7 illustrates how the surviving vertices appear in the enlarged layout and are marked by small squares. Squares marked as 48 correspond to vertices also marked 48 in FIG. 6.

Figure 8:
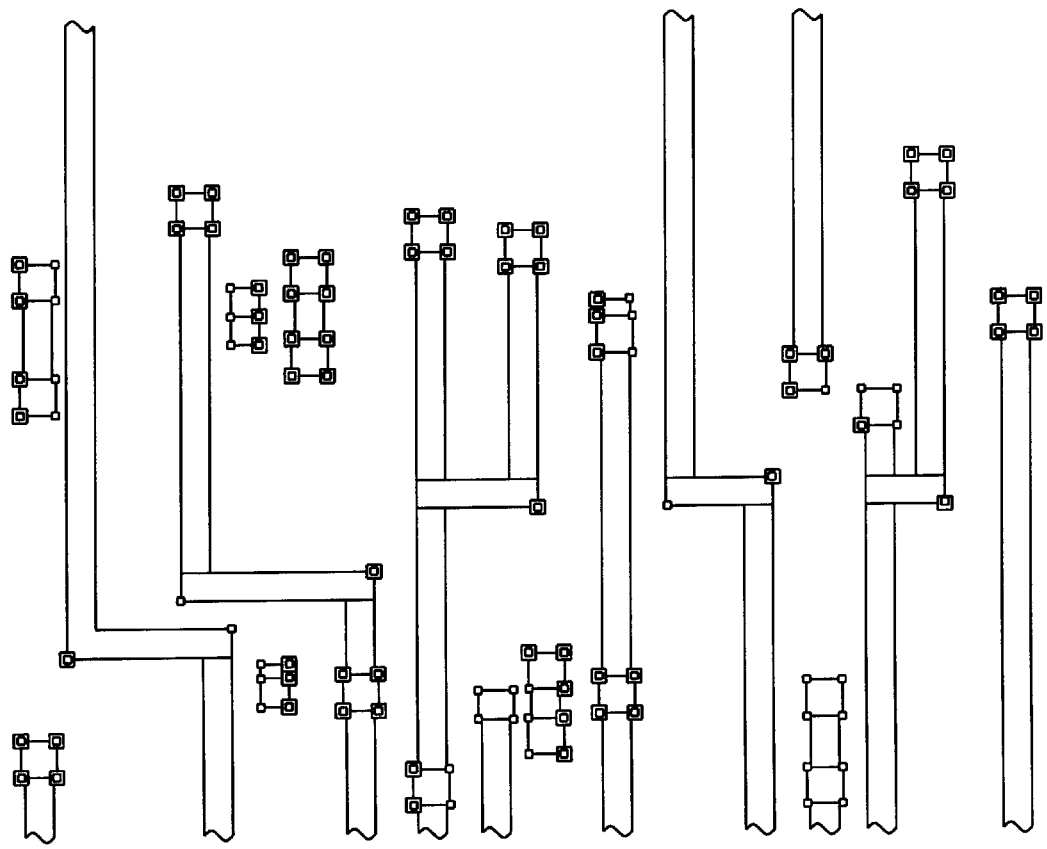
FIG. 8 is the final layout, ready for photolithography.

At the vertices that survived the widening and merging operations, the second, larger serifs are now added to the layout mask (see FIG. 7) to produce the final layout which is illustrated in FIG. 8. These second serifs have a linear dimension that is between 1.5 and 2 times that of the first serifs. As already noted, this methodology is not limited to two sets of positive serifs but could be extended to multiple sets of both positive and negative serifs.

When the above disclosed methodology is limited to two sets of positive serifs, computation time, using a Digital Alpha 500/500 Workstation on a layout file of around 15 megabytes has been around 8 minutes, with main store and hard disc requirements of about 28 and 100 megabytes respectively. This compares to a computation time of about 16 hours when conventional OPC calculations are made.

While the invention has been particularly shown and described with reference to the preferred embodiments thereof, it will be understood by those skilled in the art that various changes in form and details may be made without departing from the spirit and scope of the invention.

What is claimed is:

1. A method to compensate for distortion of a photoresist image, comprising the steps of:

providing a data file that contains a machine readable description of stripes, having width, that comprise a layout mask, having primary vertices from which a photoresist image may be formed;

storing information about each primary vertex, including a first location;

modifying the data file whereby a first serif is added at each primary vertex location;

creating an enlarged layout mask file by symmetrically increasing the width of all stripes by a critical amount and, wherever any two stripes overlap, merging said two stripes into a single stripe;

computing second locations for all vertices in the enlarged layout mask file; and further modifying the data file whereby a second serif, larger than the first serif, replaces any first serif that is on a primary vertex which is no further than 1.5 times said critical amount from any second vertex location.

2. The method of claim 1 wherein the stripe width is between about 0.2 and 0.4 microns.

3. The method of claim 1 wherein the vertices and serifs are all positive.

4. The method of claim 1 wherein the vertices and serifs are both positive and negative and the step of adding a serif further comprises adding a positive serif at a positive vertex and a negative serif at a negative vertex.

5. The method of claim 4 wherein the positive serifs have a linear dimension that is between about 1 and 1.5 times that of the negative serifs.

6. The method of claim 1 wherein said critical amount is between about 0.2 and 0.4 microns.

7. The method of claim 1 wherein there is more than one critical amount whereby multiple serifs of a size proportional to their distance from adjoining stripes may be used.

8. The method of claim 1 wherein the step of merging two stripes is a simple logical operation.

9. The method of claim 1 wherein the second serif has a linear dimension that is between 1.5 and 2 times that of the first serif.

10. The method of claim 1 wherein the first serif has a linear dimension that is between $\frac{1}{8}$ and $\frac{1}{6}$ times that of the critical amount.

11. The method of claim 1 wherein said photoresist image is used in a process for manufacturing an integrated circuit.

* * * * *